US010250076B2

(12) United States Patent
Chen et al.

(10) Patent No.: US 10,250,076 B2
(45) Date of Patent: Apr. 2, 2019

(54) WIRELESS POWER TRANSMITTER

(71) Applicant: Hong Kong Applied Science and Technology Research Institute Co. Ltd., Hong Kong (CN)

(72) Inventors: Jun Chen, Hong Kong (CN); Yan Liu, Hong Kong (CN)

(73) Assignee: Hong Kong Applied Science and Technology Research Institute Co., Ltd., Hong Kong (CN)

(*) Notice: Subject to any disclaimer, the term of this patent is extended or adjusted under 35 U.S.C. 154(b) by 260 days.

(21) Appl. No.: 15/458,971

(22) Filed: Mar. 15, 2017

(65) Prior Publication Data

US 2018/0269723 A1 Sep. 20, 2018

(51) Int. Cl.
*H02J 50/12* (2016.01)
*H02J 7/02* (2016.01)
*H03H 11/30* (2006.01)
*H03H 7/38* (2006.01)
*H03H 7/40* (2006.01)
*H02M 7/44* (2006.01)

(52) U.S. Cl.
CPC .............. *H02J 50/12* (2016.02); *H02J 7/025* (2013.01); *H03H 7/38* (2013.01); *H03H 7/40* (2013.01); *H03H 11/30* (2013.01); *H02M 7/44* (2013.01)

(58) Field of Classification Search
CPC .. H03H 7/38; H02J 50/12; H02J 17/00; H02J 5/005
USPC .......................................................... 307/104
See application file for complete search history.

(56) References Cited

U.S. PATENT DOCUMENTS

| | | | |
|---|---|---|---|
| 5,063,332 A | 11/1991 | El-Hamamsy et al. | |
| 8,330,475 B2 | 12/2012 | Van Bezooijen et al. | |
| 8,912,687 B2 * | 12/2014 | Kesler ................... | B60L 11/182 307/104 |
| 8,922,066 B2 * | 12/2014 | Kesler ................. | B60L 11/1812 307/104 |
| 9,136,914 B2 | 9/2015 | Von Novak et al. | |
| 9,242,263 B1 | 1/2016 | Copeman et al. | |

(Continued)

FOREIGN PATENT DOCUMENTS

| | | |
|---|---|---|
| CN | 103312050 A | 9/2013 |
| CN | 105226839 A | 1/2016 |
| KR | 20120008769 A | 8/2013 |

*Primary Examiner* — Daniel Kessie
*Assistant Examiner* — Swarna N Chowdhuri
(74) *Attorney, Agent, or Firm* — Eagle IP Limited; Jacqueline C. Lui

(57) ABSTRACT

A wireless power transmitter that supplies power to a load. The wireless power transmitter includes an inverter, a voltage phase detector, a current phase detector, a phase difference counter, a controller and an impedance tuning circuit. The phase difference counter counts a phase difference between the voltage phase and the current phase at the output port of the inverter. The controller receives the phase difference from the phase difference counter and generates a control signal that changes an output impedance of the inverter in response to changes of a varying impedance of the load that is coupled with the output port of the inverter wirelessly. The impedance tuning circuit receives the control signal from the controller and tunes an imaginary part of the output impedance of the inverter to zero in order to maximize a power transfer efficiency from the wireless power transmitter to the load.

20 Claims, 12 Drawing Sheets

(56) References Cited

U.S. PATENT DOCUMENTS

| | | |
|---|---|---|
| 9,407,239 B2 | 8/2016 | White et al. |
| 2012/0228954 A1* | 9/2012 | Kesler ........................ H03H 7/40 |
| | | 307/104 |
| 2014/0035384 A1 | 2/2014 | Satyamoorthy et al. |
| 2014/0319921 A1* | 10/2014 | Lisi ............................ G05F 1/12 |
| | | 307/104 |
| 2015/0051750 A1 | 2/2015 | Kurs et al. |
| 2015/0372496 A1 | 12/2015 | Lee et al. |
| 2016/0099700 A1 | 4/2016 | Tavakol |

\* cited by examiner

1000A

| C1 (pF) | C2 (pF) | C3 (pF) | C4 (pF) | C5 (pF) | K1 | K2 | K3 | K4 | K5 | K6 | Tunable Capacitor Reactance @6.78MHz (Ω) |
|---|---|---|---|---|---|---|---|---|---|---|---|
| 400 | 400 | 400 | 400 | 400 | 1 | 1 | 1 | 1 | 1 | 0 | -11.737 |
| 400 | 400 | 400 | 400 | 400 | 1 | 1 | 1 | 1 | 0 | 0 | -14.671 |
| 400 | 400 | 400 | 400 | 400 | 1 | 1 | 1 | 0 | 0 | 0 | -19.562 |
| 400 | 400 | 400 | 400 | 400 | 1 | 1 | 0 | 0 | 0 | 0 | -29.343 |
| 400 | 400 | 400 | 400 | 400 | 1 | 0 | 0 | 0 | 0 | 0 | -58.685 |
| 400 | 400 | 400 | 400 | 400 | 0 | 0 | 0 | 0 | 0 | 1 | 0 |

| C1 (pF) | C2 (pF) | C3 (pF) | C4 (pF) | C5 (pF) | K1 | K2 | K3 | K4 | K5 | K6 | Tunable Capacitor Reactance @6.78MHz (Ω) |
|---|---|---|---|---|---|---|---|---|---|---|---|
| 50 | 100 | 200 | 400 | 800 | 0 | 0 | 0 | 0 | 1 | 0 | -29.343 |
| 50 | 100 | 200 | 400 | 800 | 0 | 0 | 0 | 1 | 0 | 0 | -58.685 |
| 50 | 100 | 200 | 400 | 800 | 0 | 0 | 0 | 1 | 1 | 0 | -19.562 |
| 50 | 100 | 200 | 400 | 800 | 0 | 0 | 1 | 0 | 0 | 0 | -117.371 |
| 50 | 100 | 200 | 400 | 800 | 0 | 0 | 1 | 0 | 1 | 0 | -23.474 |
| 50 | 100 | 200 | 400 | 800 | 0 | 0 | 1 | 1 | 0 | 0 | -39.124 |
| 50 | 100 | 200 | 400 | 800 | 0 | 0 | 1 | 1 | 1 | 0 | -16.767 |
| 50 | 100 | 200 | 400 | 800 | 0 | 1 | 0 | 0 | 0 | 0 | -234.742 |
| 50 | 100 | 200 | 400 | 800 | 0 | 0 | 0 | 0 | 0 | 1 | 0 |

FIG. 10B

WIRELESS POWER TRANSMITTER

FIELD OF THE INVENTION

The present invention relates to a wireless power transmitter that supplies power to a load.

BACKGROUND

Wireless charging provides a convenient, safe, and reliable way to charge and power electrical devices at home, in the workplace, and in industry. Wireless charging uses a magnetic coupling effect, including inductive coupling and resonant coupling, to transfer power from the transmitting source to a receiving device or load. Inductive coupling induces energy from magnetic fields between closely opposing coils. A major challenge of this approach is a strictly required distance and alignments between the source and the receiving device. On the other hand, resonant coupling induces energy from magnetic fields between highly resonant coils. A major challenge for resonant coupling is off-resonance effects and mismatched loading.

New methods and systems that provide improved resonant coupling and power transfer efficiency from the transmitting source to the load will assist in advancing technological needs and solving technological problems in the field of wireless charging.

SUMMARY OF THE INVENTION

One example embodiment is a wireless power transmitter that supplies power to a load. The wireless power transmitter includes an inverter, a voltage phase detector, a current phase detector, a phase difference counter, a controller and an impedance tuning circuit. The phase difference counter counts a phase difference between the voltage phase and the current phase at the output port of the inverter. The controller receives the phase difference from the phase difference counter and generates a control signal that changes an output impedance of the inverter in response to changes of a varying impedance of the load that is coupled with the output port of the inverter wirelessly. The impedance tuning circuit receives the control signal from the controller and tunes an imaginary part of the output impedance of the inverter to zero in order to maximize a power transfer efficiency from the wireless power transmitter to the load.

Other example embodiments are discussed herein.

BRIEF DESCRIPTION OF THE DRAWINGS

FIG. 10A shows a table of impedance values provided by a capacitor array in accordance with an example embodiment.

FIG. 10B shows a table of impedance values provided by another capacitor array in accordance with another example embodiment.

DETAILED DESCRIPTION

Figure 1:
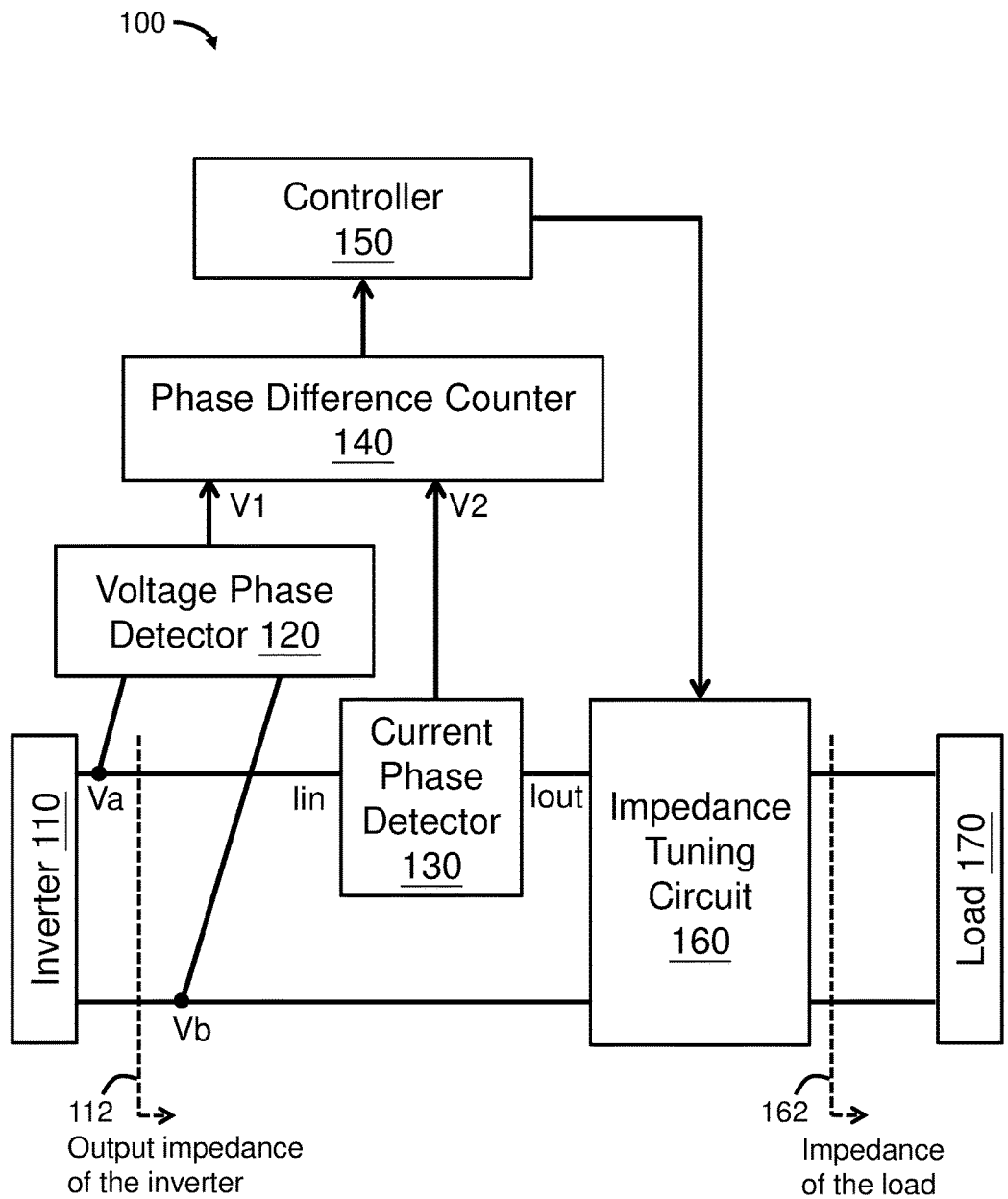
FIG. 1 shows a block diagram of a wireless power transmitter in accordance with an example embodiment.

Example embodiments relate to apparatus and methods that supply power from a transmitter to a load wirelessly with maximized power transfer efficiency.

Resonant coupling, in wireless charging applications, induces energy from magnetic fields between highly resonant coils. A major challenge for resonant coupling is providing a system with efficient power transfer from the transmitter to the load.

In order to enhance the efficiency during wireless charging, example embodiments consider and account for off-resonance effects, such as those caused by one or more of component variations, non-ideal circuits, parasitic effects, and loading changes by changes of position, material, or environment. These factors cause changes to the impedance on the load, which further causes changes to the impedance at the output of the transmitter.

Example embodiments continuously, continually, or periodically match the impedance of the load with the impedance of the transmitter in order to improve wireless charging efficiency.

One example embodiment is a wireless power transmitter that includes an inverter, a voltage phase detector, a current phase detector, a phase difference counter or detector, and a controller. The inverter converts a direct current (DC) signal at an input port of the inverter to an alternating current (AC) signal at an output port of the inverter. The phase difference counter counts a phase difference between the voltage phase and the current phase at the output port of the inverter and sends the phase difference to the controller. The controller changes an output impedance of the inverter in response to changes of a varying impedance of the load that is coupled with the output port of the inverter.

In one example embodiment, an impedance tuning circuit is connected with the controller to match the impedance of the load and the transmitter. The impedance tuning circuit eliminates the imaginary part of the reflected impedance at the output of the inverter.

Theoretically, the impedance of the load is expressed as a complex exponential in the following equation:

$$Z = R + jX = \frac{V}{I} e^{-j\omega t}.$$

In this equation, Z is the impedance at a certain port of a circuit; R is the real part of the impedance; X is the imaginary part of the impedance; V is the voltage at the port; I is the current at the port; and ω is the phase shift by which the current lags the voltage.

By way of example, for class-D switching power supply circuits, the output power is determined by the reflected real impedance. A change in the load impedance changes the reflected real impedance, and further changes the output power and the input power. The real part of reflected impedance is called the effective power or active power. On the other hand, the imaginary part of the reflected impedance is called the reactive power. For switching mode amplifiers in the transmitter, the overall power transfer efficiency is greatly impacted by the imaginary part of the output impedance of the inverter.

Example embodiments tune or change the reflected impedance by eliminating the imaginary part at the output of the inverter or power amplifier. The real part of the output impedance is not detected or tuned. Therefore, the impedance measuring and tuning circuits do not need to achieve a conjugate matching between the inverter and the load, and hence are simplified without sacrificing the power transfer efficiency from the wireless power transmitter to the load.

In one example embodiment, the impedance tuning circuit reduces an absolute value of the imaginary part of the output impedance of the inverter toward zero in order to maximize the power transfer efficiency from the inverter to the load.

In one example embodiment, the voltage phase detector and the current phase detector convert the voltage and current signals to square waves and feed the square waves to the phase difference counter to count the phase difference between the output voltage and the output current in a number of clock cycles. By counting the phase difference in a number of cycles, the phase difference is directly translated to a number, which can be used in a lookup table of a controller as an index to find corresponding action. It provides straight forward measurement of the phase difference and accelerates the impedance tuning procedure.

In one example embodiment, the phase difference detector or counter detects the difference between a first phase and a second phase and generates a number based on the detected phase difference. The number sequence is further integrated in a periodical cycle by an integrator in the phase difference counter and averaged over this periodical cycle in the phase difference counter. The averaged number is sent to the controller of the wireless power transmitter to tune the output impedance of the inverter.

In one example embodiment, the impedance tuning circuit includes a capacitor array with a number of capacitors connected in parallel and switches each connecting with one of the capacitors to turn on or turn off the capacitors in response to the control signal from the controller.

In one example embodiment, the controller determines the capacitance value of the capacitor array based on a lookup table that is stored in a memory of the controller and the phase difference between the output voltage and the output current.

FIG. 1 shows a block diagram of a wireless power transmitter 100 in accordance with an example embodiment. The wireless power transmitter 100 includes an inverter 110, a first phase detector or voltage phase detector 120, a second phase detector or current phase detector 130, a phase difference counter 140, a controller 150 and an impedance tuning circuit 160. A load 170 is coupled with the output port of the inverter.

As shown in FIG. 1, the impedance of the load is the impedance looking into the load as pointed by arrow 162. The output impedance of the inverter is the impedance looking from the inverter toward the load as pointed by arrow 112.

The inverter converts a direct current (DC) signal at an input port of the inverter to an alternating current (AC) signal at an output port of the inverter. By way of example, the inverter includes a switching amplifier.

The voltage phase detector detects a first phase or a voltage phase of an output voltage at the output port of the inverter. The current phase detector detects a second phase or a current phase of an output current at the output port of the inverter. The phase difference counter receives information from the current and voltage phase counters and counts a phase difference between the output voltage phase and the output current phase. The controller receives the phase difference from the phase difference counter and generates a control signal that changes an output impedance of the inverter in response to changes of the load impedance. The impedance tuning circuit receives the control signal from the controller and tunes an imaginary part of the output impedance of the inverter to zero in order to maximize a power transfer efficiency from the wireless power transmitter to the load.

In an example embodiment, the impedance tuning circuit reduces an absolute value of the imaginary part of the output impedance of the inverter toward zero by adding and/or reducing a capacitance value to the output of the inverter.

In an example embodiment, the phase difference counter counts a difference between the first phase of the output voltage and the second phase of the output current in a number of clock cycles.

In an example embodiment, the inverter includes a class-D amplifier with two transistors that converts DC signals to AC signals. The output port of the inverter is wirelessly coupled to a load, for example, a resonant antenna or a resonator coil. A transmitter coil transmits electric power across an intervening space to a resonant receiver coil in the load. The impedance tuning circuit is connected with the output of the inverter. The impedance measurement is realized by the voltage phase detector, the current phase detector and the phase difference counter. The phase difference is fed into the controller, for example, a microcontroller unit (MCU) or a programmable logic device. The controller executes an algorithm based on a lookup table stored in the controller to change the output impedance of the inverter in response to changes of a varying load impedance.

Figure 2A:
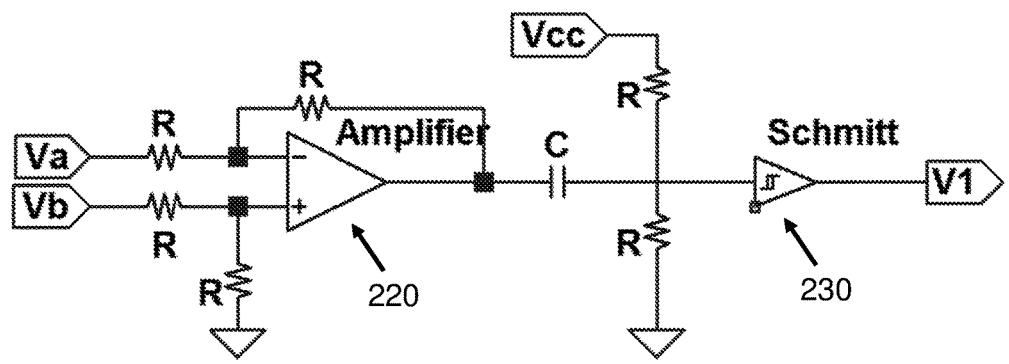
FIG. 2A shows a circuit diagram of a voltage phase detector in accordance with an example embodiment.

FIG. 2A shows a circuit diagram of a voltage phase detector 210 in accordance with an example embodiment.

As shown in FIG. 2A, the voltage phase detector 210 is a threshold detection circuit for phase detection or extraction. The voltage phase detector includes an amplifier 220, a Schmitt trigger 230 and a number of resistors and capacitors. For example, the input ports of the amplifier 220 are connected with the output ports of an inverter shown in FIG. 1. The output voltage at the two output ports of the inverter is labeled as Va and Vb. The output voltages of the inverter are amplified by the amplifier 220 in a form of sine waves. The Schmitt trigger 230 that is connected with the amplifier 220 converts the sine waves of the voltage signal to square waves V1. As one example, a rising edge of the square waves corresponds to the zero phase of the output voltage of the inverter.

By way of example, the Schmitt trigger 230 is a comparator with hysteresis implemented by applying positive feedback to a noninverting input of a comparator or a differential amplifier. The output of the Schmitt trigger retains its value until the input changes sufficiently to trigger a change. As one example, the Schmitt trigger works in a two-threshold manner. The output of the Schmitt trigger is high when the input is higher than a first threshold, for example, 0.5V. The output turns to low when the input is lower than a second threshold, for example, −0.5V. The output retains its previous value for input between −0.5V to 0.5V. Schmitt trigger is used to remove small signal variation presented on the input signal.

Figure 2B:
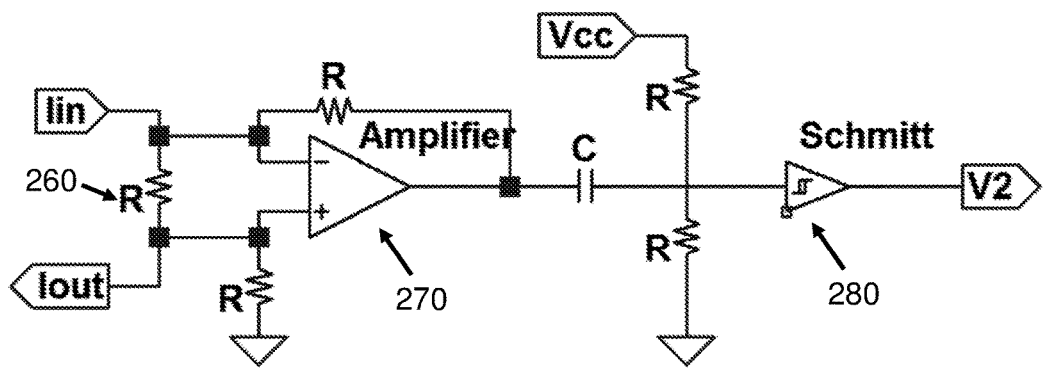
FIG. 2B shows a circuit diagram of a current phase detector in accordance with an example embodiment.

FIG. 2B shows a circuit diagram of a current phase detector 250 in accordance with an example embodiment.

As shown in FIG. 2B, the current phase detector includes a high precision low value resistor 260, an amplifier 270, a Schmitt trigger 280 and a number of resistors and capacitors. By way of example, the resistor 260 senses the current Iin, converts it to a voltage signal and sends the converted voltage signal to the amplifier 270. The amplifier 270 amplifies the voltage signal in a form of sine waves. The Schmitt trigger 280 that is connected with the amplifier 270 converts the sine waves to square waves V2.

By way of example, the current phase detector 250 is connected with an output port of the inverter in series as shown in FIG. 1. The output current of the inverter in a form of sine waves is converted to a voltage signal in a form of square waves V2, by the current phase detector. The converted voltage signal V2 in the form of square waves represents the phase of the output current at the output port of the inverter. As one example, a rising edge of the square wave corresponds to the zero phase of the output current of the inverter.

Figure 3:
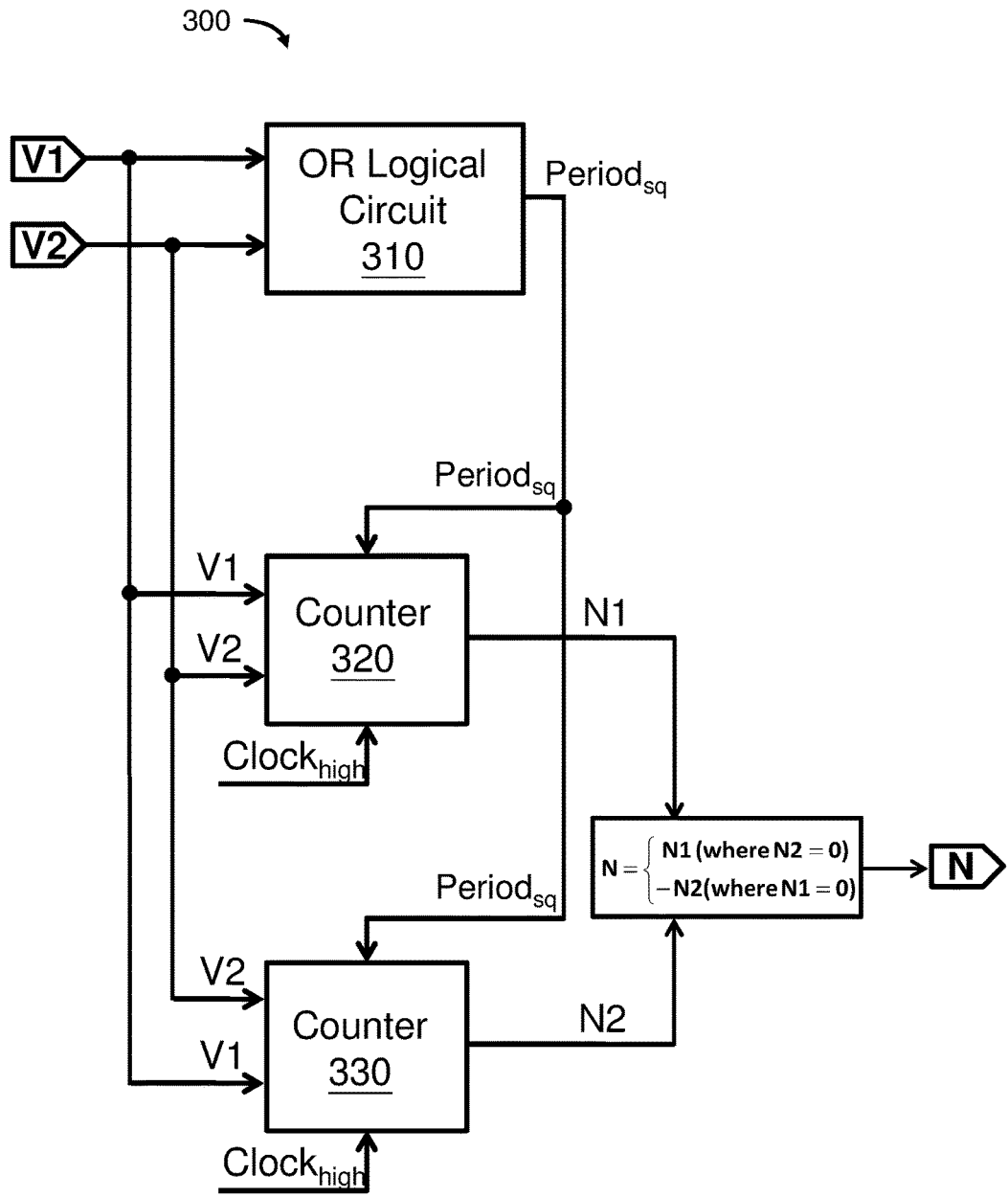
FIG. 3 shows a block diagram of a phase difference counter in accordance with an example embodiment.

FIG. 3 shows a block diagram of a phase difference counter 300 in accordance with an example embodiment.

The phase difference counter 300 includes an OR logical circuit 310 and two counters 320 and 330. An output of the OR logical circuit 310 is connected with counters 320 and 330.

In an example embodiment, two square waveforms V1 and V2 from a voltage phase detectors and a current phase detectors, respectively, are sent to the OR logical circuit 310. The OR logical circuit 310 generates a period signal Period$_{sq}$, based on the square waveforms V1 and V2 at the input. The period signal Period$_{sq}$ enables the two counters 320 and 330.

The counters 320 and 330 start counting when the intensities of V1 and V2 at the input are at a high level for either one (the OR logic) and will be reset when both intensities are at a low level. This working mechanism enables continuous measurement of the phase difference between V1 and V2.

In one example embodiment, V1, in the form of square waves, represents a phase of the output voltage of the inverter as shown in FIG. 1. V2, in the form of square waves, represents a phase of the output current of the inverter as shown in FIG. 1. The counter 320 starts counting when it receives a rising edge of V1, and stops counting when it receives a rising edge of V2. The counter 330 starts counting when it receives a rising edge of V2, and stops counting when it receives a rising edge of V1.

By way of example, the counter 320 starts to work when a rising edge of a voltage square wave arrives first, stops at the time of the arrival of a rising edge of a current square wave, and generates a counting output N1. The counter 330 starts to work when a rising edge of the current square wave arrives first, stops at the time of arrival of a rising edge of voltage square wave, and generates a counting output N2. N1 and N2 are mutual exclusive at any given time. N1 and N2 are further processed to determine a phase difference number N between the output voltage and the output current of the inverter in FIG. 1. The determination is shown below:

$$N = \begin{cases} N1 & \text{(where } N2 = 0) \\ -N2 & \text{(where } N1 = 0) \end{cases}$$

When N1 presents a number while N2 is zero, it means the voltage waveform is taking lead of the current waveform, and the phase difference number N is given a positive sign with N=N1. When N2 presents a number while N1 is zero, it means the current waveform is taking lead of the voltage waveform, and the phase difference N is given a negative sign with N=−N2.

By way of example, a clock signal is sent to the counters 320 and 330 to count the difference between a first phase of V1 and a second phase of V2 in a number of clock cycles. The phase difference N counted by clock cycles is further converted to a digital signal that is read by the controller.

Figure 4:
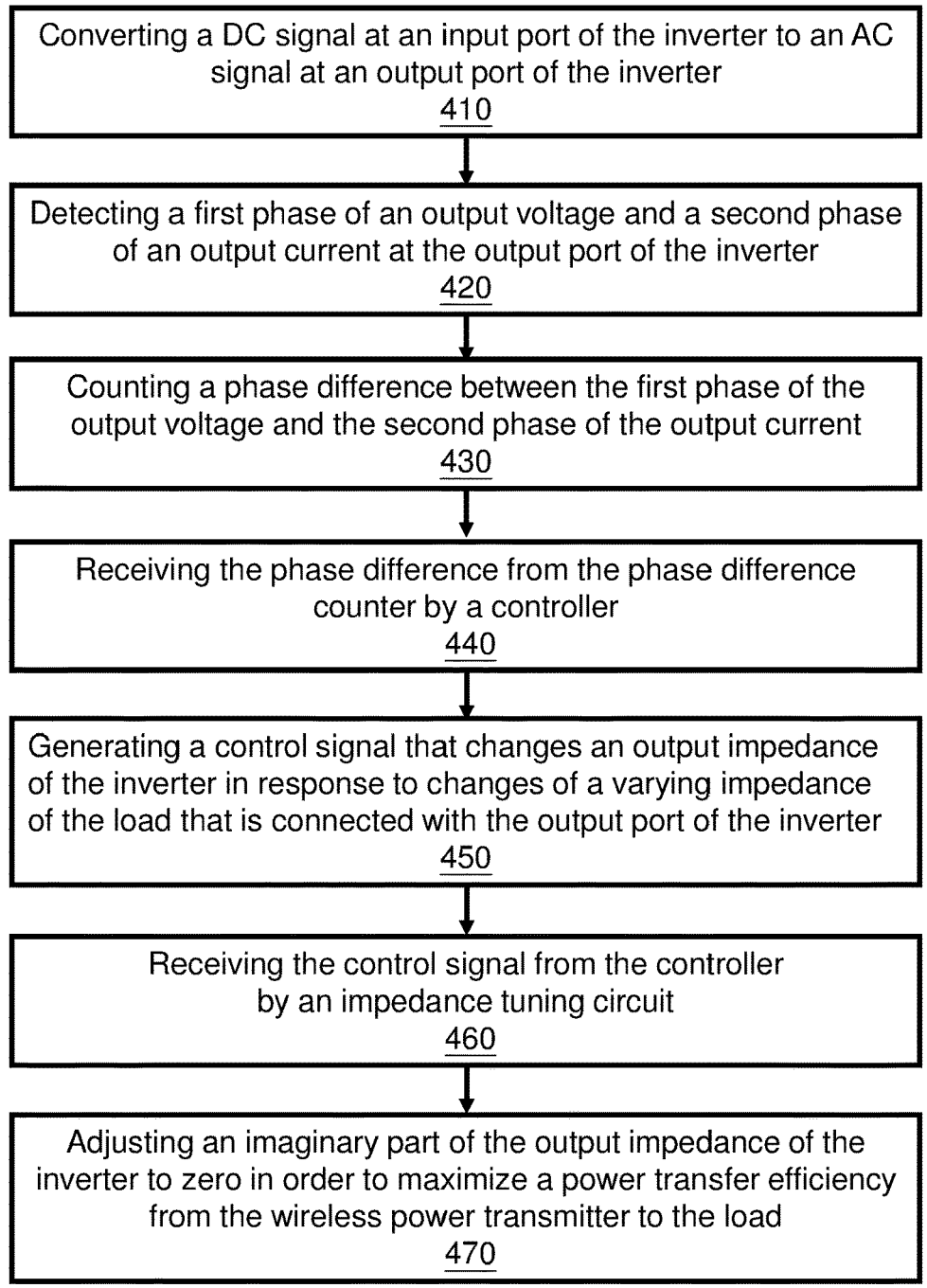
FIG. 4 shows a method executed by a wireless power transmitter in accordance with an example embodiment.

FIG. 4 shows a method executed by a wireless power transmitter in accordance with an example embodiment.

Block 410 states converting a DC signal at an input port of the inverter to an AC signal at an output port of the inverter.

Consider an example in which a wireless power transmitter includes an inverter, a voltage phase detector, a current phase detector, a phase difference counter or detector, a controller and an impedance tuning circuit. The wireless power transmitter supplies power to a load that is coupled with the output port of the inverter.

The inverter converts a DC signal at an input port of the inverter to an AC signal at an output port of the inverter. By way of example, the inverter includes a switching amplifier or a class-D amplifier. The analog signal to be amplified is converted to a series of pulses by pulse width modulation, pulse density modulation or other method before being applied to the amplifier.

Block 420 states detecting a first phase of an output voltage and a second phase of an output current at the output port of the inverter.

The voltage phase detector detects a first phase of the output voltage at the output port of the inverter. The current phase detector detects a second phase of the output current at the output port of the inverter.

By way of example, the voltage phase detector is connected with the output port of the inverter to convert the sine waves of the voltage signal to square waves. The current phase detector is connected with the output port of the inverter in series to convert sine waves of the current signal to square waves of a voltage signal. Then the converted voltage signal is further processed to extract the signal phase. The converted voltage signal in the form of square waves represents the phase of the current signal at the output port of the inverter.

Block 430 states counting a phase difference between the first phase of the output voltage and the second phase of the output current.

The phase difference counter receives information from the current and voltage phase counters and counts a phase difference between the first and second phases, which are the output voltage phase and the output current phase, respectively.

In one example embodiment, the phase difference detector detects the difference between the first phase and the second phase and generates a number based on the detected phase difference. The sequence of number is further integrated in a periodical cycle by an integrator in the phase difference counter and averaged over the periodical cycle in the phase difference detector. The averaged number is sent to the controller of the wireless power transmitter to tune the output impedance of the inverter.

Block 440 states receiving the phase difference from the phase difference counter by a controller.

By way of example, the controller is connected with the phase difference counter. The phase difference counter counts a phase difference in a number of clock cycles and sends the number of clock cycles to the controller of the wireless power transmitter for further processing. As one example, the phase difference counter converts the number in series order according to an Inter-Integrated Circuit (I2C) bus protocol and send it to the controller through the I2C bus.

Block 450 states generating a control signal that changes an output impedance of the inverter in response to changes of a varying impedance of the load that is wirelessly coupled with the output port of the inverter.

The controller receives the phase difference from the phase difference counter and generates a control signal that changes an output impedance of the inverter in response to changes of a varying load impedance.

In one example embodiment, the controller generates the control signal based on a lookup table stored in a memory of the controller. The lookup table determines a capacitance value of a capacitor array in the impedance tuning circuit based on received phase difference in a form of clock cycles or digital signals.

Block 460 states receiving the control signal from the controller by an impedance tuning circuit.

By way of example, the impedance tuning circuit is a capacitor array that has a tunable capacitance controlled by the controller.

Block 470 states adjusting an imaginary part of the output impedance of the inverter to zero in order to maximize a power transfer efficiency from the wireless power transmitter to the load.

The impedance tuning circuit receives the control signal from the controller and tunes an imaginary part of the output impedance of the inverter to zero in order to maximize a power transfer efficiency from the wireless power transmitter to the load.

In one example embodiment, the impedance tuning circuit includes a capacitor array with a number of capacitors connected in parallel and switches each connecting with one of the capacitors. The switches switch states between an open state and a closed state in response to the control signal from the controller to reach a capacitance value of the capacitor array and hence reduce the absolute value of the imaginary part of the output impedance of the inverter.

Figure 5A:
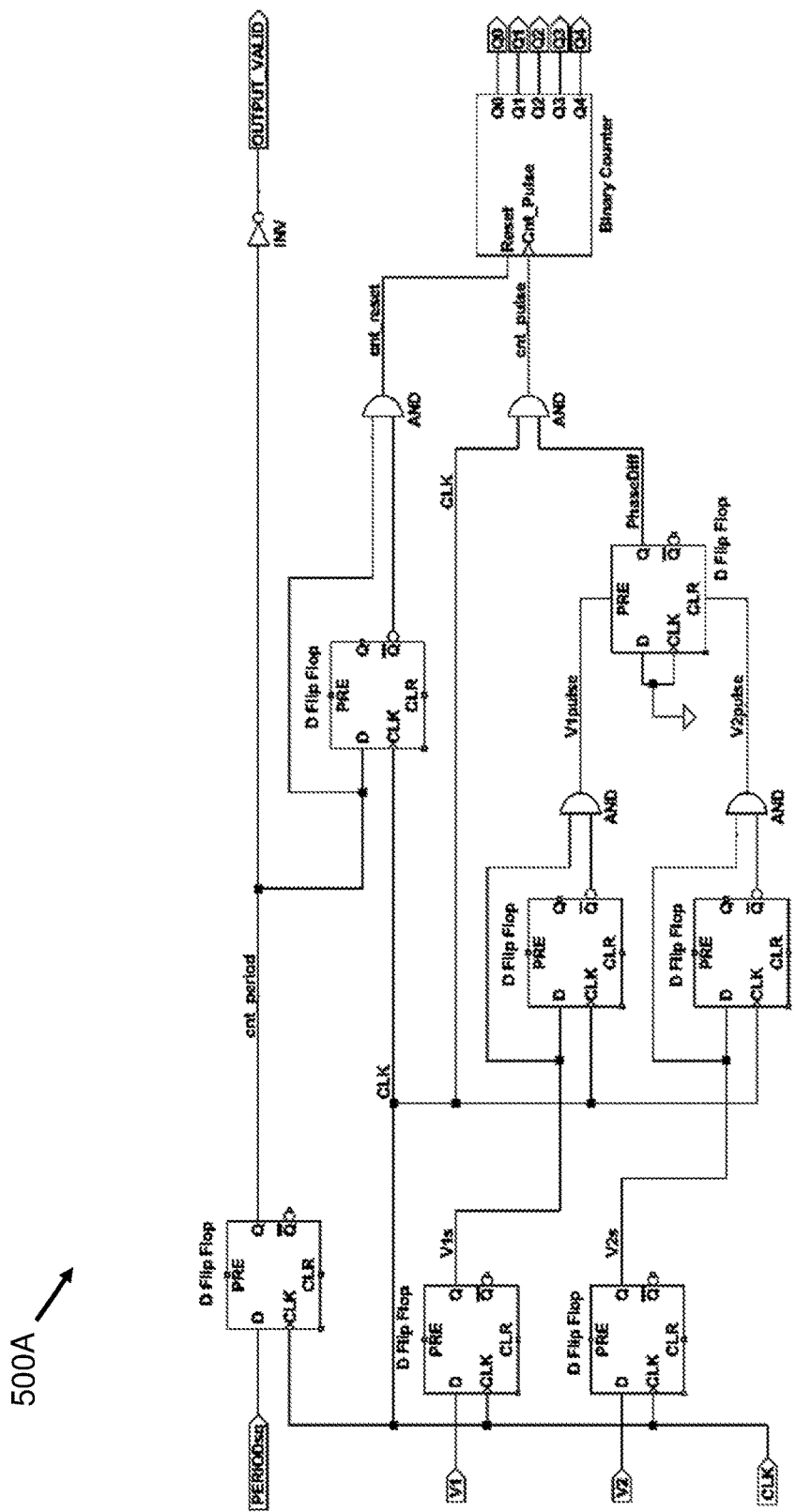
FIG. 5A shows a circuit diagram of a counter in accordance with an example embodiment.

FIG. 5A shows a circuit diagram of a counter 500A in accordance with an example embodiment.

As shown in FIG. 5A, the counter 500A counts the phase difference between a voltage waveform V1 and a current waveform V2, in a number of clocks N1. As one example, the voltage waveform V1 is taking lead of the current waveform V2.

By way of example, the PERIODsq signal is first sampled by the clock signal to be synchronized by the clock edge. Then it passes through a single pulse generation circuit to obtain a single pulse aligned with the rising edge of PERIODsq. This single pulse is used to reset the binary counter and get ready for the counting the phase difference. The end of the PERIODsq signal designates the readiness of the counter, so the output from binary counter is valid.

In one example embodiment, the voltage waveform V1 and the current waveform V2 are first sampled by the clock signal to be synchronized by the clock edge. Then both V1 and V2 pass through a single pulse generation circuit to obtain a single pulse aligned with the rising edge of the V1 and V2, respectively. The two generated single pulses V1 pulse and V2 pulse are used to generate the phase difference signal. Then the clock between the phase differences are extracted as cnt_pulse and counted in a binary counter.

Figure 5B:
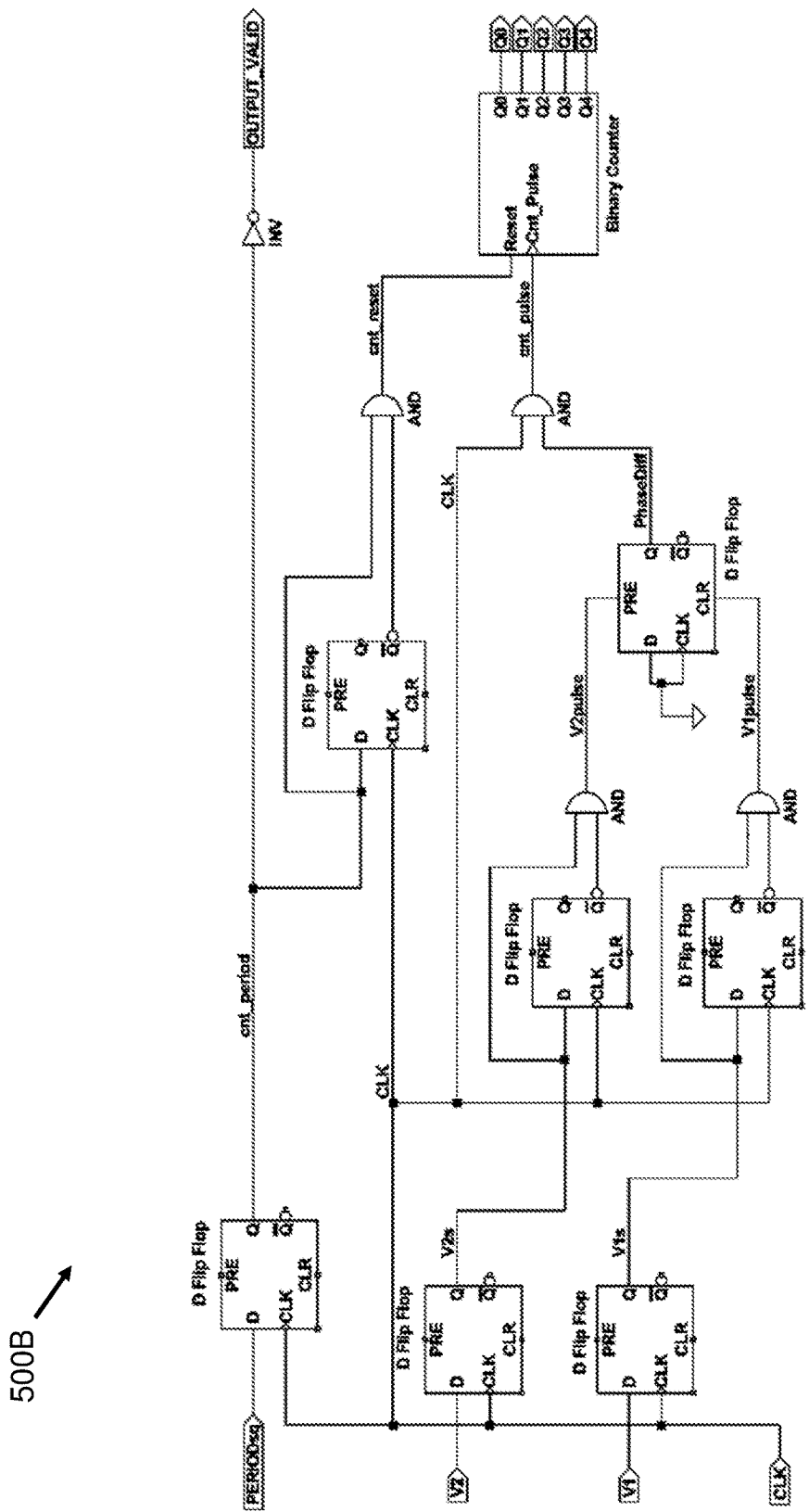
FIG. 5B shows a circuit diagram of a counter in accordance with another example embodiment.

FIG. 5B shows a circuit diagram of a counter 500B in accordance with another example embodiment.

As shown in FIG. 5B, the counter 500B counts the phase difference between a voltage waveform V1 and a current waveform V2, in a number of clocks N2. As one example, the current waveform V2 is taking lead of the voltage waveform V1.

The counter 500B is similar to the counter 500A as shown in FIG. 5A except that the input of V1 and V2 are swapped in position such that the current waveform V2 is taking lead of the voltage waveform V1.

Figure 6:
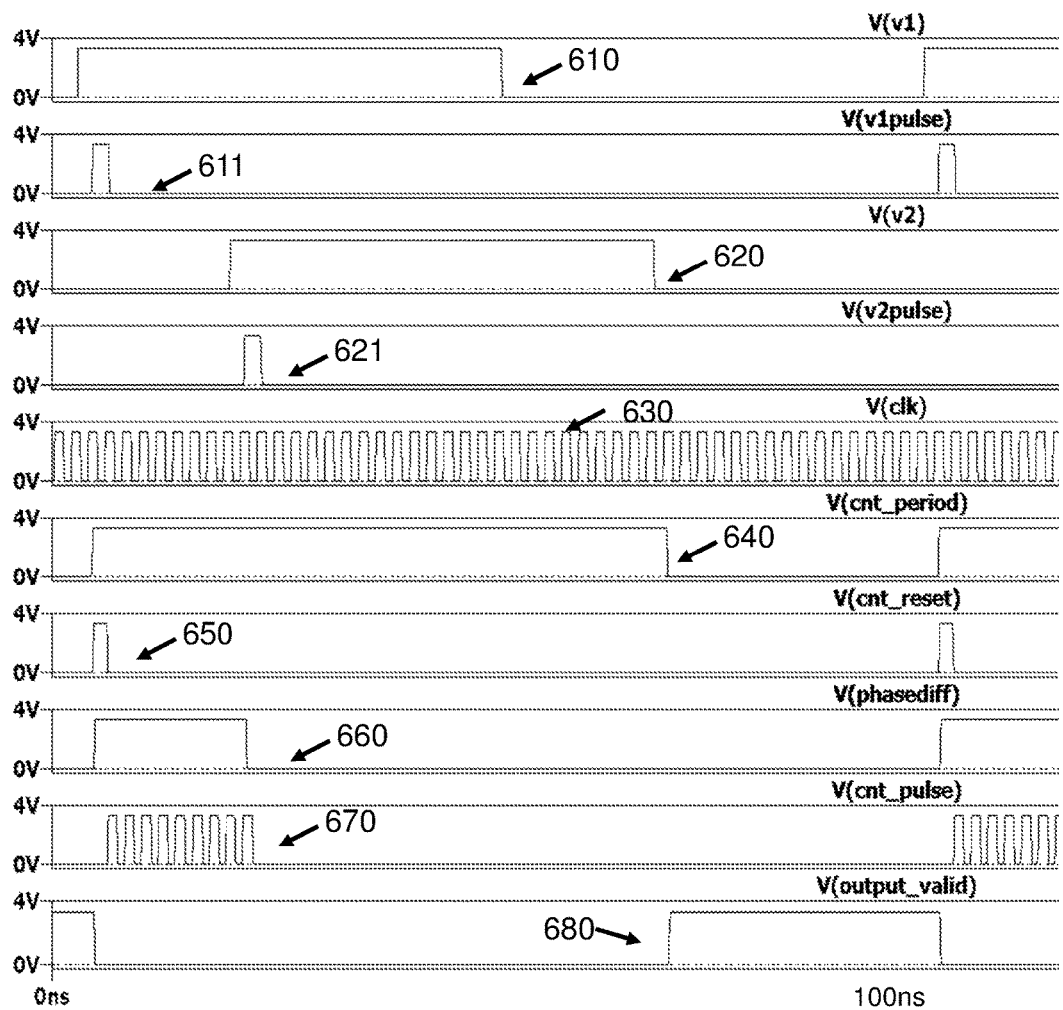
FIG. 6 shows a waveform example in a phase difference counter in accordance with an example embodiment.

FIG. 6 shows a waveform example in a phase difference counter in accordance with an example embodiment.

Consider an example in which an impedance matching system that matches the impedance of a transmitter and a load that is coupled with the transmitter. The impedance matching system includes a phase difference counter, a controller and an impedance tuning circuit. The controller receives the phase difference from the phase difference counter and generates a control signal that changes an output impedance of the transmitter in response to detecting that changes occur to the load that is coupled with the transmitter.

As shown in FIG. 6, waveform 610 is a voltage waveform with the rising edge corresponding to the zero phase of the output voltage of the inverter. Waveform 620 is a current waveform with the rising edge corresponding to the zero phase of the output current of the inverter. Waveform 630 is a clock signal which has a cycle much shorter than the voltage or current waveform. Waveform 611 is a single pulse with the rising edge corresponding to the start of the voltage waveform. Waveform 621 is a single pulse with the rising edge corresponding to the start of the current waveform. Waveform 640 is a clock sampled periodic signal from an OR logical circuit in the phase difference counter, where either a voltage waveform or a current waveform is at a high level. Waveform 650 is a PERIODsq signal after passing through a single pulse generation circuit. It is a single pulse aligned with the rising edge of PERIODsq signal. This single pulse is used to reset the binary counter and get ready for counting the phase difference. Waveform 680 is the invert of the PERIODsq signal and marks the readiness of the counter output. The end of the PERIODsq signal designates that the output from binary counter is valid. Waveform 660 is the signal corresponding to the phase difference between the voltage waveform 610 and the current waveform 620. A rising edge of the signal corresponds to a first phase reference point of the voltage signal. As one example, the first phase reference point corresponds to the zero phase of the voltage signal. A falling edge of the signal corresponds to a first phase reference point of the current signal. As one example, the first phase reference point corresponds to the zero phase of the current signal. Waveform 670 is the clocks inside the phase difference between the voltage waveform and current waveform. The number of clock cycles are counted over the period of PERIODsq signal and is read by the controller on the end of every PERIODsq cycle.

By way of example, the counted phase difference represented by clock cycles is further read by the controller to generate a control signal to tune an imaginary part of the output impedance of the transmitter to zero in order to maximize a power transfer efficiency from the transmitter to the load.

Figure 7A:
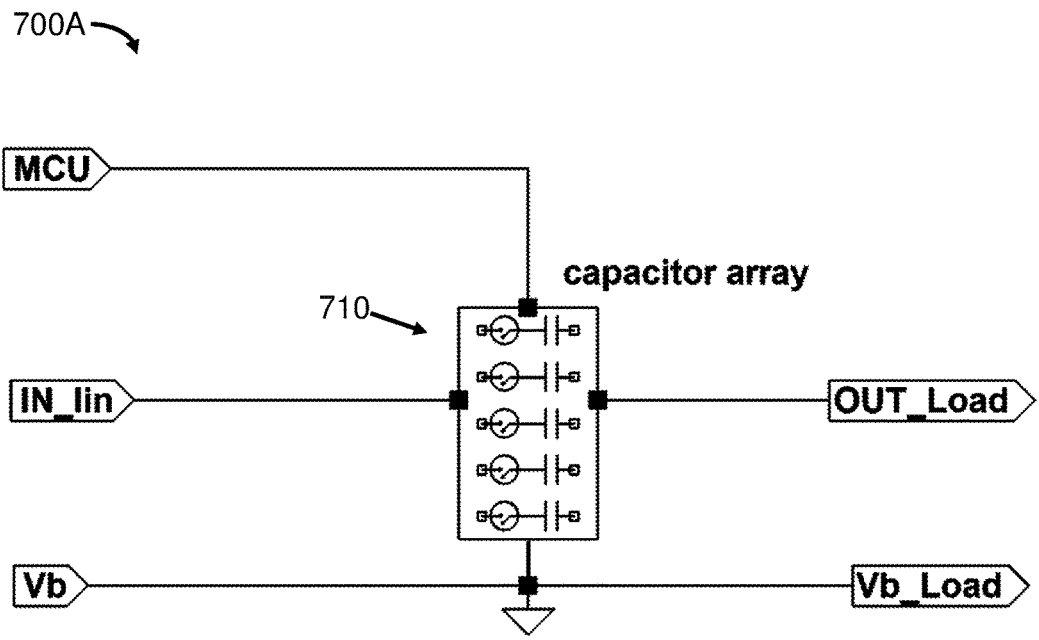
FIG. 7A shows a block diagram of an impedance tuning circuit in accordance with an example embodiment.

FIG. 7A shows a block diagram of an impedance tuning circuit 700A in accordance with an example embodiment.

By way of example, the impedance tuning circuit 700A includes a capacitor array 710 that is placed in series with the load. As one example, the capacitor array is controlled by a controller to switch on or switch off each capacitor inside the capacitor array.

Figure 7B:
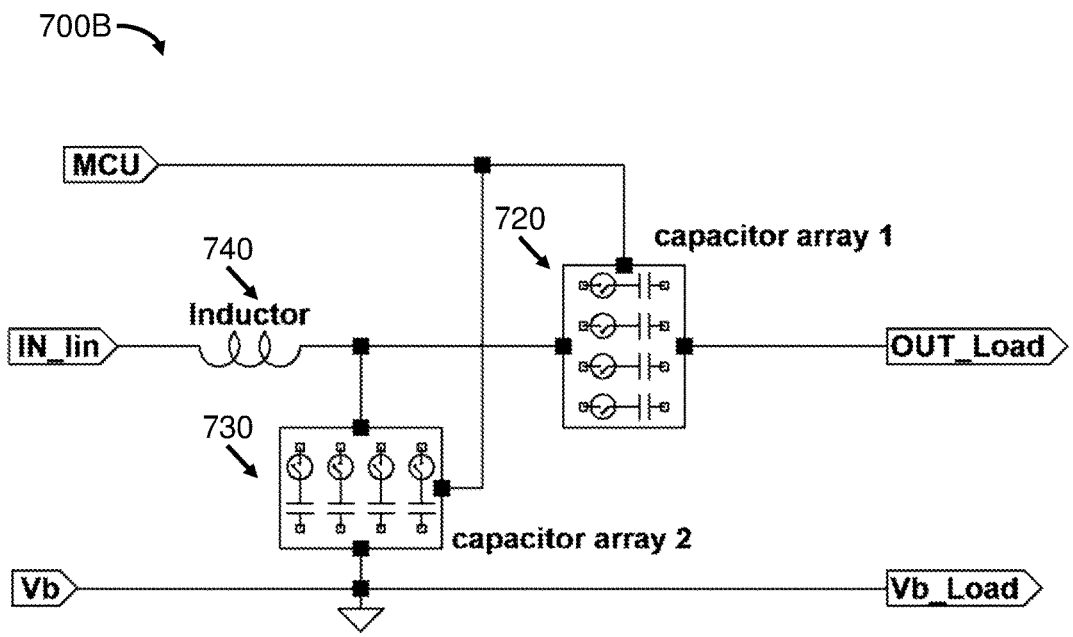
FIG. 7B shows another block diagram of an impedance tuning circuit in accordance with an example embodiment.

FIG. 7B shows another block diagram of an impedance tuning circuit 700B in accordance with an example embodiment.

By way of example, the impedance tuning circuit 700B includes an inductor 740, a capacitor array 720 that is placed in series with the load, and a capacitor array 730 that is placed in the middle of the inductor and the capacitor array 720. The capacitor array 730 is connected with the load in parallel. Both capacitor arrays 720 and 730 are controlled by s controller to switch on or switch off each capacitor inside the capacitor array.

Figure 8A:
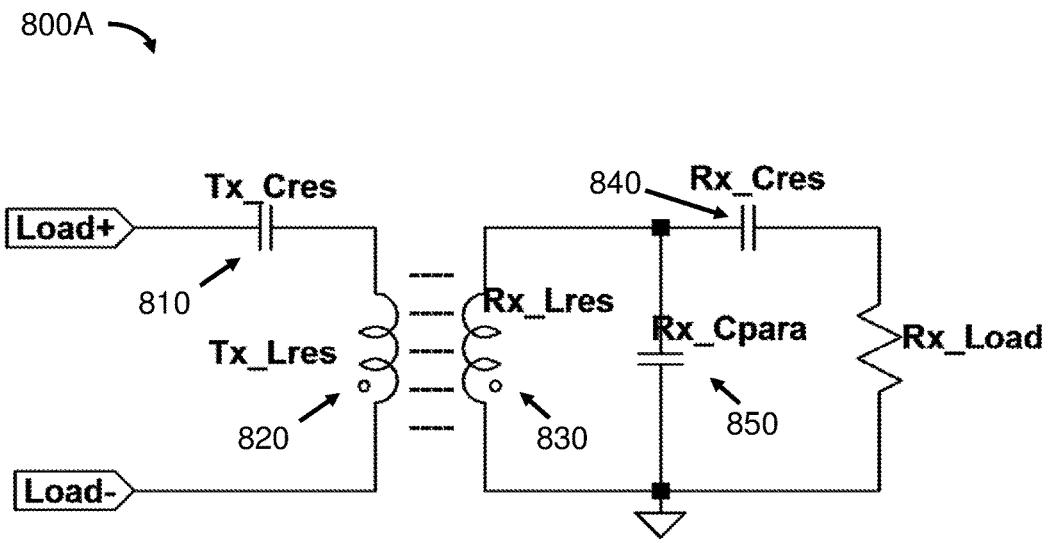
FIG. 8A shows a block diagram of a load in accordance with an example embodiment.

FIG. 8A shows a block diagram of a load 800A in accordance with an example embodiment.

By way of example, the load 800A includes a Tx capacitor 810 and a Tx inductor 820 in resonate state, and a Rx inductor 830 and a Rx capacitor 840 in resonate state. There is a resonate coupling between the Tx inductor 820 and the Rx inductor 830. In one example, there is another parallel capacitor 850 that is connected with the Rx inductor 830 in parallel.

Figure 8B:
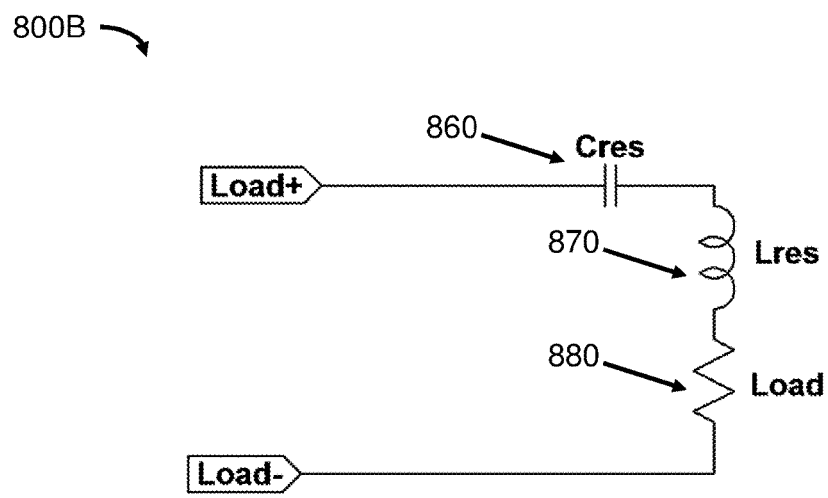
FIG. 8B shows a block diagram of an equivalent load in accordance with an example embodiment.

FIG. 8B shows a block diagram of an equivalent load 800B in accordance with an example embodiment.

By way of example, the equivalent load is a load of a resonate wireless power transmitter. The equivalent load 800B includes a capacitor 860, an inductor 870 and a resistor 880 in a resonate state.

Figure 9:
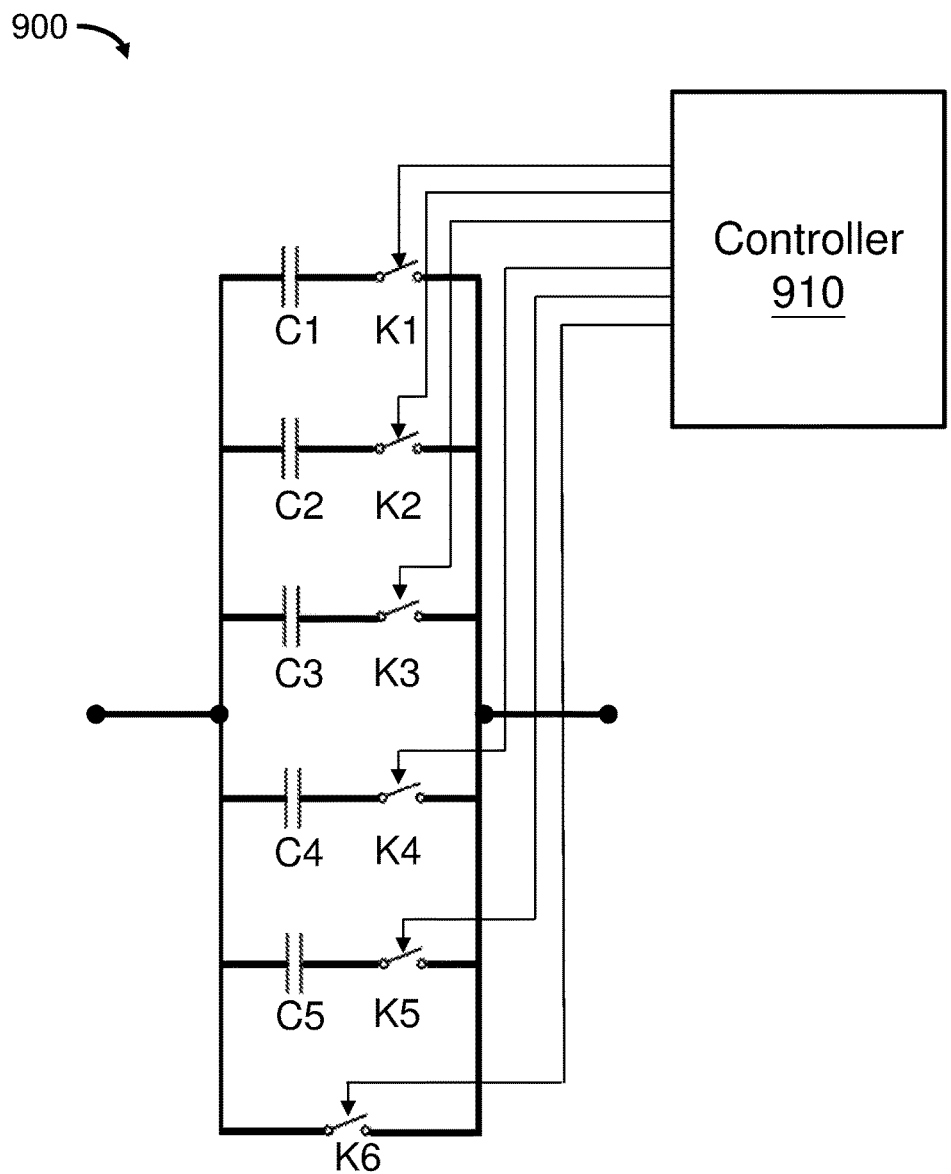
FIG. 9 shows a block diagram of a tunable capacitor array in accordance with an example embodiment.

FIG. 9 shows a block diagram of a tunable capacitor array 900 in accordance with an example embodiment.

In one example embodiment, the capacitor array includes five capacitors C1, C2, C3, C4 and C5 that are connected in parallel. A plurality of switches K1, K2, K3, K4 and K5 are connected with each of the capacitors, respectively. The switches are connected with a controller 910 and are switchable between an open state and a closed state. The switches switch states to turn on or turn off the capacitors in response to a control signal from the controller 910 in order to reach a capacitance value of the capacitor array.

In one example embodiment, the controller determines the capacitance value of the capacitor array based on a lookup table stored in the controller.

FIG. 10A shows a table 1000A of impedance values provided by a capacitor array in accordance with an example embodiment.

Consider an example in which five capacitors C1, C2, C3, C4 and C5 are connected in parallel. Each capacitor is connected with its corresponding switch K1, K2, K3, K4 or K5. The switches turn on or turn off one or more capacitors in response to a control signal from a controller. As one example, the switches are controlled by a MCU through a digital I/O port. The controller determines the impedance value of the capacitor array based on a lookup table stored in the controller. As one example, the five capacitors have the same capacitance value of 400 pF, therefore the reactance provided by the capacitor array has five values.

As shown in table 1000A, five capacitors connected in parallel provide 5 different reactance values by turning on or turning off one or more of the capacitors in the capacitor array. The changes on resistance values are negligible assuming the capacitor has small embedded series resistance. Therefore, the capacitor array only tunes or changes the imaginary part of an impedance of a circuit.

FIG. 10B shows another table 1000B of impedance values provided by another capacitor array in accordance with another example embodiment.

Consider an example in which five capacitors C1, C2, C3, C4 and C5 are connected in parallel. Each capacitor is connected with its corresponding switch K1, K2, K3, K4 or K5. The switches turn on or turn off one or more capacitors in response to a control signal from a controller. As one example, the switches are controlled by a MCU through a digital I/O port. The controller determines the impedance value of the capacitor array based on a lookup table stored in the controller. As one example, the five capacitors have different capacitance values and the variance of the reactance can reach up to 32 different values.

As shown in table 1000B, five capacitors with different capacitance values connected in parallel provide up to 32 different reactance values by turning on or turning off one or more of the capacitors in the capacitor array. The changes on resistance values are negligible assuming the capacitor has small embedded series resistance. Therefore, the capacitor array only tunes or changes the imaginary part of an impedance of a circuit.

Figure 11:
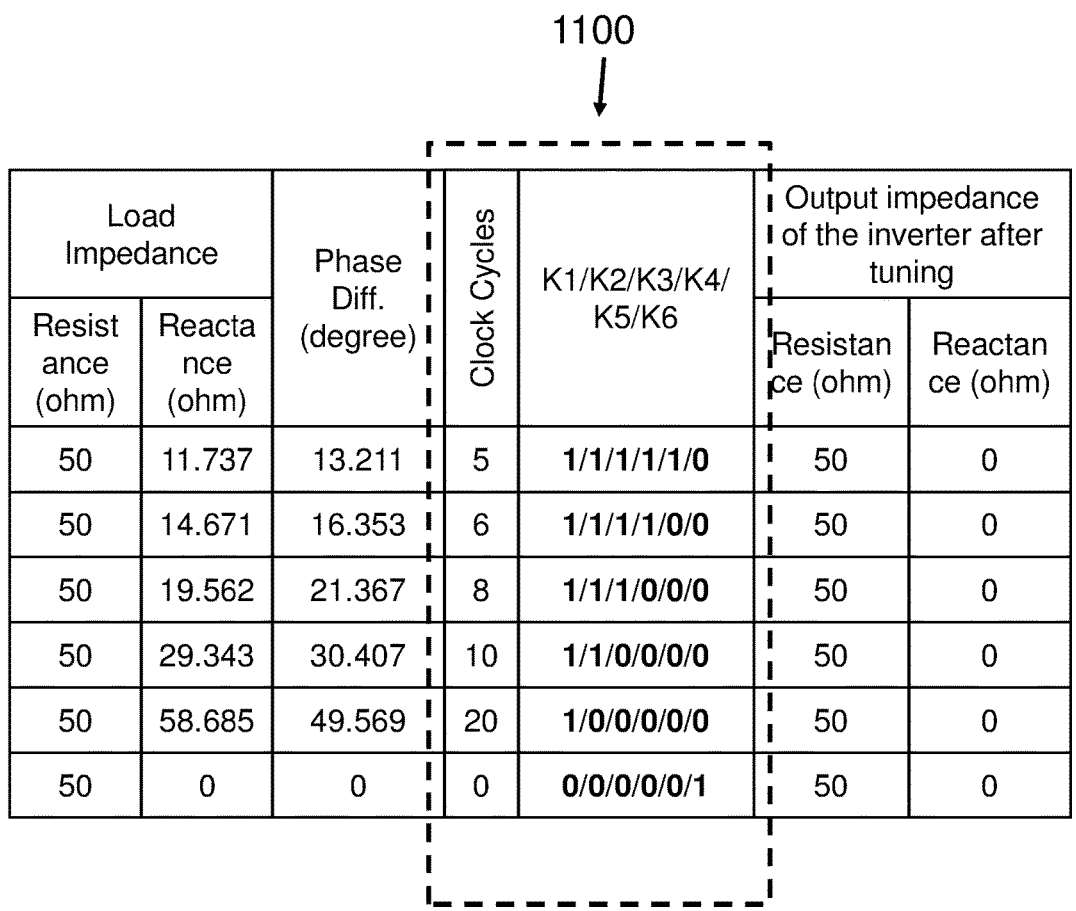
FIG. 11 shows a lookup table in accordance with an example embodiment.

FIG. 11 shows a lookup table 1100 in accordance with an example embodiment.

Consider an example in which an impedance matching system that matches the impedance of a transmitter with a load. The impedance matching system includes a phase difference counter that counts a phase difference between a voltage signal and a current signal at the output port of the transmitter, a controller that is connected with the phase difference counter and a capacitor array that is connected with the controller and the output port of the transmitter. The capacitor array includes six capacitors C1, C2, C3, C4, C5 and C6 that are connected in parallel. Each capacitor is connected with its corresponding switch K1, K2, K3, K4, K5 or K6.

In one example embodiment, a pre-set lookup table is stored in a memory of the controller. The lookup table provides a number of capacitance values in response to phase differences counted in clock cycles. The controller receives the phase difference from the phase difference counter and searches in the lookup table to determine a capacitance value of the capacitor array in order to tune the output impedance of the transmitter to match a varying load impedance.

As shown in the lookup table 1100 of FIG. 11, each clock cycles corresponds to different phase in degrees between a voltage signal and a current signal at the output the transmitter, which further reflects the imaginary part of the output impedance of the transmitter. To reduce the absolute value of the imaginary part, the capacitors C1, C2, C3, C4, C5 and C6 in the capacitor array are turned on or off by their corresponding switches K1, K2, K3, K4, K5 and K6, in response to the phase difference counted by the counter. In the lookup table, "0" stands for an open state of the switch, which turns off the capacitor that is connected with the switch. "1" stands for a closed state of the switch, which turns on the capacitor that is connected with the switch.

The lookup table that is stored in a controller functions as an index for the controller to find corresponding action. It accelerates the impedance tuning procedure.

As used herein, a "wireless power transmitter" is a transmitter that transfers electrical energy to an electrical load wirelessly.

As used herein, a "phase detector" is a circuit that detects a phase of an input signal.

As used herein, a "phase difference counter" or "phase difference detector" is a circuit that detects the difference in phase between its two input signals.

As used herein, an "impedance matching system" is a system that provides impedance matching between a transmitter and a receiver.

As used herein, an "impedance tuning circuit" is a circuit with tunable impedance.

As used herein, a "threshold detection circuit" is a circuit that converts an input signal to square waves.

The methods and apparatus in accordance with example embodiments are provided as examples, and examples from one method or apparatus should not be construed to limit examples from another method or apparatus. Further, methods and apparatus discussed within different figures can be added to or exchanged with methods and apparatus in other figures. Further yet, specific numerical data values (such as specific quantities, numbers, types, degrees, etc.) or other specific information should be interpreted as illustrative for discussing example embodiments.

What is claimed is:

1. A wireless power transmitter that supplies power to a load, comprising:
    an inverter that converts a direct current (DC) signal at an input port of the inverter to an alternating current (AC) signal at an output port of the inverter;
    a first phase detector that detects a first phase of an output voltage at the output port of the inverter;
    a second phase detector that detects a second phase of an output current at the output port of the inverter;
    a phase difference counter that counts a phase difference between the first phase of the output voltage and the second phase of the output current;
    a controller that receives the phase difference from the phase difference counter and generates a control signal that changes an output impedance of the inverter in response to changes of a varying impedance of the load that is coupled with the output port of the inverter; and
    an impedance tuning circuit that receives the control signal from the controller and tunes an imaginary part of the output impedance of the inverter to zero in order to maximize a power transfer efficiency from the wireless power transmitter to the load.

2. The wireless power transmitter of claim 1, wherein the impedance tuning circuit reduces an absolute value of the imaginary part of the output impedance of the inverter toward zero in order to maximize the power transfer efficiency from the inverter to the load.

3. The wireless power transmitter of claim 1, wherein the phase difference counter counts a difference between the first phase of the output voltage and the second phase of the output current in a number of clock cycles.

4. The wireless power transmitter of claim 1, wherein the first phase detector further includes:
    a threshold detection circuit that converts the output voltage to a first signal in a form of square waves, wherein a rising edge of the square waves corresponds to a first phase reference point of the first signal.

5. The wireless power transmitter of claim 1, wherein the second phase detector further includes:
    a converter that converts the output current to a voltage; and
    a threshold detection circuit that converts the voltage to a second signal in a form of square waves, wherein a rising edge of the square waves corresponds to a second phase reference point of the second signal.

6. The wireless power transmitter of claim 1, wherein the phase difference counter further includes:
    an OR logical circuit that generates a period signal based on a first signal that corresponds to the output voltage and a second signal that corresponds to the output current;
    a first counter enabled by the period signal that starts counting when the first counter receives a rising edge of the first signal, and stops counting when the first counter receives a rising edge of the second signal; and
    a second counter enabled by the period signal that starts counting when the second counter receives a rising edge of the second signal, and stops counting when the second counter receives a rising edge of the first signal,
    wherein a clock signal is sent to the first counter and the second counter to count the difference between the first phase and the second phase in a number of clock cycles, and
    wherein the first and second signals are square waves.

7. The wireless power transmitter of claim 1, wherein the impedance tuning circuit includes:
    a capacitor array having a plurality of capacitors connected in parallel; and
    a plurality of switches each connecting with one of the capacitors and switchable between an open state and a closed state,
    wherein the switch switches states in response to the control signal from the controller to reach a capacitance value of the capacitor array.

8. The wireless power transmitter of claim 1, wherein the controller generates the control signal based on a lookup table and an algorithm, wherein the lookup table determines a capacitance value of a capacitor array in the impedance tuning circuit.

9. A method executed by a wireless power transmitter that supplies power to a load, the method comprising:
    converting, by an inverter of the wireless power transmitter, a direct current (DC) signal at an input port of the inverter to an alternating current (AC) signal at an output port of the inverter;
    detecting, by a first phase detector of the wireless power transmitter, a first phase of an output voltage at the output port of the inverter;
    detecting, by a second phase detector of the wireless power transmitter, a second phase of an output current at the output port of the inverter;
    counting, by a phase difference counter of the wireless power transmitter, a phase difference between the first phase of the output voltage and the second phase of the output current;
    receiving, by a controller of the wireless power transmitter, the phase difference from the phase difference counter;
    generating, by the controller of the wireless power transmitter, a control signal that changes an output impedance of the inverter in response to changes of a varying impedance of the load that is coupled with the output port of the inverter;

receiving, by an impedance tuning circuit of the wireless power transmitter, the control signal from the controller; and adjusting, by the impedance tuning circuit of the wireless power transmitter, an imaginary part of the output impedance of the inverter to zero in order to maximize a power transfer efficiency from the wireless power transmitter to the load.

10. The method of claim 9, further comprising:

generating, by the phase difference counter, a number based on the phase difference between the first phase of the output voltage and the second phase of the output current;

integrating, by an integrator of the phase difference counter, the number in a periodical cycle;

generating, by the phase difference counter and based the number, an average number over the periodical cycle; and sending, by the phase difference counter, the average number to the controller.

11. The method of claim 9, further comprising:

converting, by a converter, the output current to a voltage;

converting, by the first phase detector, the output voltage to a first signal in a form of square waves;

converting, by the second phase detector, the output current to a second signal in a form of square waves; and sending, by the first and second phase detectors, the first and second signals to the phase difference counter.

12. The method of claim 9, further comprising:

generating, by an OR logical circuit of the phase difference counter, a period signal based on a first signal that corresponds to the output voltage and a second signal that corresponds to the output current; and counting, by the phase difference counter, a time between a rising edge of the first signal and a rising edge of the second signal, wherein the phase difference counter is enabled by the period signal, and wherein a clock signal is sent to the phase difference counter to count the difference between the first phase and the second phase in a number of clock cycles.

13. The method of claim 9, further comprising:

reducing an absolute value of the imaginary part of the output impedance of the inverter toward zero in order to maximize the power transfer efficiency from the inverter to the load.

14. The method of claim 9, further comprising:

generating, by the controller, the control signal based on a lookup table and an algorithm, wherein the lookup table determines a capacitance value of a capacitor array in the impedance tuning circuit.

15. An impedance matching system that connects to an amplifier of an inverter and a load, comprising:

a first phase detector that detects a first phase of an output voltage at the output port of the inverter;

a second phase detector that detects a second phase of an output current at the output port of the inverter;

a phase difference detector that detects a phase difference between the first phase of the output voltage and the second phase of the output current;

a controller that receives the phase difference from the phase difference counter and generates a control signal that changes an output impedance of the inverter in response to detecting that changes occur to the load that is coupled with the impedance matching system; and an impedance tuning circuit that receives the control signal from the controller and changes an imaginary part of the output impedance of the inverter to zero in order to maximize a power transfer efficiency from the inverter to the load.

16. The impedance matching system of claim 15, wherein the phase difference detector detects the difference between the first phase and the second phase, generates a number based on the difference between the first phase and the second phase, integrates the number in a periodical cycle, generates an average number over the periodical cycle, and sends the average number to the controller.

17. The impedance matching system of claim 15, wherein the impedance tuning circuit reduces an absolute value of the imaginary part of the output impedance of the inverter toward zero in order to maximize the power transfer efficiency from the inverter to the load.

18. The impedance matching system of claim 15, wherein the phase difference counter further includes:

an OR logical circuit that generates a period signal based on a first signal that corresponds to the output voltage and a second signal that corresponds to the output current;

a first counter enabled by the period signal that starts counting when the first counter receives a rising edge of the first signal, and stops counting when the first counter receives a rising edge of the second signal; and a second counter enabled by the period signal that starts counting when the second counter receives a rising edge of the second signal, and stops counting when the second counter receives a rising edge of the first signal, wherein a clock signal is sent to the first counter and the second counter to count the difference between the first phase and the second phase in a number of clock cycles, and wherein the first and second signals are square waves.

19. The impedance matching system of claim 15, wherein the impedance tuning circuit includes:

a capacitor array having a plurality of capacitors connected in parallel; and a plurality of switches each connecting with one of the capacitors and switchable between an open state and a closed state, wherein the switch switches states in response to the control signal from the controller to reach a capacitance value of the capacitor array.

20. The impedance matching system of claim 15, wherein the controller generates the control signal based on a lookup table and an algorithm, wherein the lookup table determines a capacitance value of a capacitor array in the impedance tuning circuit.

* * * * *